United States Patent
Wochner et al.

(10) Patent No.: US 6,309,467 B1
(45) Date of Patent: Oct. 30, 2001

(54) METHOD FOR PRODUCING A SEMICONDUCTOR MATERIAL

(75) Inventors: Hanns Wochner, Burghausen; Theresia Bauer, Burgkirchen; Josef Dietl, Neuötting; Werner Ott, Tann, all of (DE); Herbert Pichler, Ach (AT); Wilhelm Schmidbauer, Emmerting (DE); Dieter Seifert, Neuötting (DE); Susanne Weizbauer, Rosenheim (DE)

(73) Assignee: Wacker-Chemie GmbH, Munich (DE)

( * ) Notice: Subject to any disclaimer, the term of this patent is extended or adjusted under 35 U.S.C. 154(b) by 0 days.

(21) Appl. No.: 09/153,197

(22) Filed: Sep. 15, 1998

(30) Foreign Application Priority Data

Sep. 19, 1997 (DE) .............................. 197 41 465

(51) Int. Cl.$^7$ ................... C23G 1/02; B08B 3/08
(52) U.S. Cl. ................. 134/2; 134/3; 134/28; 423/348; 423/350
(58) Field of Search ................ 423/348, 349, 423/350; 437/233; 117/932; 134/2, 3, 26, 28, 902

(56) References Cited

U.S. PATENT DOCUMENTS

| | | | |
|---|---|---|---|
| 4,193,974 | * 3/1980 | Kotval et al. | 423/348 |
| 4,195,067 | * 3/1980 | Kotval et al. | 423/348 |
| 5,067,989 | * 11/1991 | Yokota et al. | 148/33 |
| 5,071,488 | * 12/1991 | Takayama et al. | 134/34 |
| 5,346,557 | 9/1994 | Ito et al. | 134/10 |
| 5,472,513 | * 12/1995 | Shiramizu | 134/3 |
| 5,509,970 | * 4/1996 | Shiramizu | 134/3 |
| 5,681,398 | * 10/1997 | Muraoka | 134/3 |
| 5,976,481 | * 11/1999 | Kubota et al. | 423/348 |
| 6,146,467 | * 11/2000 | Takaishi et al. | 134/3 |

FOREIGN PATENT DOCUMENTS

| | | |
|---|---|---|
| 4209865 | 9/1993 | (DE) . |
| 19529518 | 2/1996 | (DE) . |
| 0548504 | 10/1992 | (EP) . |

OTHER PUBLICATIONS

English Patent Abstract corresponding to DE 4209865.
English Patent Abstract corresponding to DE 19529518.
Patent Abstracts of Japan, vol. 018, No. 590 (E–1628), Nov. 10, 1994 & JP 06224169A (Sharp Corp.), Aug. 12, 1994.
Patent Abstracts of Japan, vol. 017, No. 259 (C–1061), May 21, 1993 & JP 05004811A (Shin Etsu Handotai Co.) Jan. 14, 1993.
Kern W. et al: "Cleaning solutions based on hydrogen peroxide for use in silicon semiconductor technology" RCA Review, Bd. 31, Jun. 1970, pp. 187–206.
Patent Abstracts of Japan, vol. 018, No. 225 (E–1541) Apr. 22, 1994 & JP 06021034A (Nec Kyushu Ltd) Jan. 28, 1994.
Radiochemical Study of Semiconductor Surface Contamination, RCA Review Jun. 1970, W. Kern.
Purifying Si and SiO2 Surfaces with Hydrogen Peroxide, RCA Laboratories, W. Kern Apr. 1994.

\* cited by examiner

Primary Examiner—Randy Gulakowski
Assistant Examiner—Saeed Chaudhry
(74) Attorney, Agent, or Firm—Collard & Roe, P.C.

(57) ABSTRACT

Semiconductor material has a low metal concentration at the surface. The semiconductor material has an iron content and/or chromium content on the surface of less than $6.66 \times 10^{-11}$ $g/cm^2$. A method for producing this semiconductor material includes a preliminary cleaning, a main cleaning and hydrophilization. A device for use in this method has a container with pyramid-shaped recesses at the bottom.

7 Claims, No Drawings

METHOD FOR PRODUCING A SEMICONDUCTOR MATERIAL

BACKGROUND OF THE INVENTION

1. Field of the Invention

The invention relates to polycrystalline silicon, a method for producing it and a device for producing it.

2. The Prior Art

High-purity semiconductor material is needed for the production of solar cells or electronic components, for example, memory elements or microprocessors. The dopants introduced in a controlled manner are the sole impurities which should be present in such a material. An attempt is therefore made to minimize the concentrations of harmful impurities. It is frequently observed that even semiconductor material produced under high-purity conditions becomes contaminated again in the course of the further processing to produce the final products. Thus, expensive cleaning steps are repeatedly necessary to reacquire the original purity. Foreign metal atoms which are built into the crystal lattice of the semiconductor material disturb the charge distribution and may reduce the functioning of the subsequent component or result in its failure. Consequently, contamination of the semiconductor material by metallic impurities should be avoided. This applies to silicon which is the semiconductor material most frequently used in the electronics industry.

High-purity silicon is obtained, for example, by thermal decomposition of readily volatile silicon compounds. These compounds, such as trichlorosilane, can therefore be purified easily by distillation methods. Under these circumstances, polycrystalline silicon is produced in the form of ingots having typical diameters of 70 to 300 mm and lengths of 50 to 2500 mm. A large proportion of the ingots is used to produce crucible-drawn monocrystals, strips and foils or to produce polycrystalline solar-cell raw material. Since these products are produced from high-purity molten silicon, it is necessary to melt solid silicon in crucibles. In order to make this operation as efficient as possible, large-volume, solid pieces of silicon, such as, the polycrystalline ingots mentioned, have to be comminuted before melting. This is normally always associated with a superficial contamination of the semiconductor material. This is because the comminution is carried out with metallic crushing tools, such as jaw crushers or roll-type crushers, hammers or chisels.

During the comminution, care has to be taken to ensure that the surfaces of the fragments are not contaminated with impurities. Contamination by metal atoms is to be regarded as critical since these may alter the electrical properties of the semiconductor material in a harmful way. If the semiconductor material to be comminuted is comminuted with mechanical tools, such as steel crushers, the fragments have to be subjected to a surface cleaning before melting.

Mechanically machined polycrystalline silicon or polycrystalline silicon granules which have been produced from mechanically machined products can be used as silicon starting material. This starting material is for the production of monocrystalline silicon. However, it is necessary to reduce the concentration of iron atoms and/or chromium atoms which are present on the surface of the mechanically machined polycrystalline silicon.

Mechanically machined particles of polycrystalline silicon can be used as starting material for monocrystalline silicon. In this case, the surface of the mechanically machined polycrystalline silicon is etched with a mixture of nitric acid and hydrofluoric acid. This process is widely used, but it cannot adequately reduce the concentration of iron atoms and/or chromium atoms on the surface of the polysilicon.

DE-A1 195 29 518 discloses that polycrystalline silicon is first cleaned with a mixture of aqua regia (a mixture of hydrochloric acid and nitric acid) and is furthermore cleaned with hydrofluoric acid. This process, however, achieves only a mean iron value of $73.32 \times 10^{-11}$ g/cm$^2$.

JP 051-54466 describes a cleaning process in which hydrofluoric acid and nitric acid are used. A mean iron value of $23.31 \times 10^{-11}$ g/cm$^2$ was achieved.

SUMMARY OF THE INVENTION

It is an object of the present invention to provide semiconductor material, in particular polycrystalline silicon, which has a very low iron/chromium content.

It is a further object of the invention to provide a cleaning device with which the low iron/chromium content can be achieved.

These objects are achieved by the present invention, which relates to a composition comprising a semiconductor material which has a low metal concentration on the surface. This semiconductor material has an iron content and/or chromium content on the surface of less than $6.66 \times 10^{-11}$ g/cm$^2$. This semiconductor material has a particle diameter of from 0.1 to 350 mm, preferably from 20 to 150 mm.

The semiconductor material includes silicon, indium phosphide, germanium or gallium arsenide. Silicon, in particular polycrystalline silicon, is preferred.

A polycrystalline silicon is comminuted by means of metallic crushing tools. These are made of steel which has been hardened with iron carbide and/or chromium carbide.

During the comminution of the polycrystalline silicon with these metals, the metal particles are pressed into the oxide layer and the uppermost layer of the silicon lattice. For this reason, cleaning mixtures which do not remove silicon, for example $HCl/H_2O_2$, cannot completely remove the abraded metal material. A complete cleaning is consequently necessary.

The invention furthermore relates to a method for producing semiconductor material which has a low metal concentration, which method comprises washing polycrystalline silicon in a preliminary cleaning in at least one stage with an oxidizing cleaning solution, washing it in a main cleaning in a further stage with a cleaning solution which contains nitric acid and hydrofluoric acid, and, during hydrophilization, washing it in yet a further stage with an oxidizing cleaning liquid.

In a preliminary cleaning step, the semiconductor material, in particular the polycrystalline silicon fragment, is preferably first rinsed with fully demineralized water having a resistivity of 15–18 Mohm and then washed with an oxidizing cleaning solution. This oxidizing cleaning solution is preferably hydrogen peroxide, mineral acids, such as hydrochloric acid, nitric acid, sulfuric acid, phosphoric acid, perchloric acid, hydrofluoric acid, liquid, linear or branched organic acids containing 1 to 8 carbon atoms, such as acetic acid, formic acid, butyric acid, etc.

All these oxidizing substances can also be used, insofar as it is technically possible, in any desired mixtures, which may also contain hydrogen peroxide in addition. Furthermore, surfactants may also be present, such as, anionic surfactants preferably, ammonium lauryl sulfate or sodium alkyl sulfate.

An aqueous oxidizing cleaning solution is preferred which contains 4 to 20% w/w hydrochloric acid, 1 to 10% w/w hydrofluoric acid and 1 to 5% w/w hydrogen peroxide as a mixture. The balance is 65 to 94% w/w of water. The percentages by weight are based upon the total weight of the cleaning solution. This preliminary cleaning is preferably followed by a rinsing step using fully demineralized water having a resistivity of 15–18 Mohm.

This is followed by the main cleaning step, in which an aqueous mixture of nitric acid and hydrofluoric acid is used. This aqueous mixture preferably contains 60 to 70% w/w nitric acid, 1 to 5% w/w hydrofluoric acid and 25 to 39% by weight of water. The percentages by weight are based upon the total weight of the cleaning solution.

The main cleaning step may also preferably be divided up by first washing with an aqueous cleaning solution containing hydrofluoric acid and nitric acid, in which the content of nitric acid is less than 70% w/w, said mixture preferably containing 60 to 70% w/w nitric acid, 1 to 5% w/w hydrofluoric acid and 25% to 39% by weight of water. Then washing is carried out in a further step with a cleaning solution which contains hydrofluoric acid and nitric acid. Here the content of nitric acid is greater than 70% w/w, and the mixture preferably contains 70 to 95% w/w nitric acid, 1 to 5% w/w hydrofluoric acid and 0% to 29% by weight of water. The percentages by weight are based upon the total weight of the cleaning solution. The main cleaning in two steps makes possible a silicon removal by etching of less than 5 $\mu$m.

Furthermore, the mixtures of nitric acid and hydrofluoric acid may furthermore contain the abovementioned mineral acids, along with liquid, linear or branched organic acids containing 1 to 8 carbon atoms, hydrogen peroxide and surfactants. All the substances may be contained in any concentrations and mixing ratios, provided this is technically possible.

This preliminary cleaning step is preferably followed by a rinsing step using fully demineralized water having a resistivity of 15–18 Mohm.

This is followed by hydrophilizing with an oxidizing cleaning liquid. This cleaning liquid is preferably composed of mineral acids, as defined above, and liquid, linear or branched organic acids containing 1 to 8 carbon atoms, as defined above.

All these substances can also be used, as far as technically possible, in any mixtures, and hydrogen peroxide may also be present in the mixture. Furthermore, surfactants, as defined above may also be present in the mixture.

A preferred cleaning solution contains 4 to 20% w/w hydrochloric acid and 1 to 3% w/w hydrogen peroxide, 8 to 70% w/w nitric acid and 7 to 87% w/w water. The percentages by weight are based upon the total weight of the aqueous cleaning solution. The hydrophilization step is preferably followed by a rinsing step using fully demineralized water having a resistivity of 15–18 Mohm.

Preferably, all the cleaning steps are carried out in such a way that the semiconductor material to be cleaned is immersed in a container having openings in a cleaning liquid, and cleaning liquid flows in through the openings and wets the polycrystalline silicon, then the container is raised far enough out of the liquid for the cleaning liquid to be able to flow completely out through the openings in the container. Associated with these cleaning liquids is also the wash with fully demineralized water having a resistivity of 15–18 Mohm.

In the method according to the invention, the semiconductor material in a container is immersed at least twice in the cleaning liquid by means of a lifting and lowering movement. Preferably, these lifting and lowering movements are carried out in such a way that the containers can drain completely while they are lifted out of the cleaning solution, the cleaning solution flowing out completely. Preferably, this lifting and lowering movement is carried out 10 times per minute for up to 4 minutes.

The cleaning process is preferably carried out at normal pressure and room temperature (25° C.). The main cleaning process step is preferably carried out at 5° C. to 12° C. and particularly preferably at 8° C. to 10° C. Because of the low temperature, the residence time can be prolonged (for example, 3 to 5 seconds to 7 to 10 seconds), which effects a reduction in stain formation.

Cleaning devices for cleaning semiconductor material are known in which the semiconductor material, in particular the polycrystalline silicon fragments, is rotated in a roller or is moved up and down in the acid by lifting and lowering movements. In the roller process, appreciable plastics material abrasion which contaminates the baths and, consequently the surface of the polysilicon fragments occurs during the circulation of the sharp-edged polysilicon fragments. The process of lifting and lowering movements is notable for the fact that too low a flow through the polysilicon bulk material reduces the cleaning action (see also Comparison Experiment in Table 10).

The invention furthermore relates to a cleaning device which has a container having openings, the cleaning device moving the container by means of lifting and lowering movement so that the container is completely removed from the cleaning liquid. The cleaning device is constructed such that a motor lifts a preferably rectangular container with lifting and lowering movements. This container contains the semiconductor material and has openings at least in the bottom. The motor lifts it out of the cleaning liquid with lifting and lowering movements so that the container is completely removed from the cleaning liquid and also drains completely during each of these lifting and lowering movements.

Preferably, the container has pyramid-shaped recesses at the bottom of the container. Each of the apices of the pyramids preferably points upward from the bottom of the container. Thus the bottom of the container is covered with pyramid-shaped recesses whose apices point upward from the bottom preferably perpendicularly or, alternatively, at a slight angle.

These pyramid-shaped recesses have openings which are situated preferably in the triangular sides of the pyramid-shaped recesses. In the process according to the invention, the cleaning liquid can drain through these openings. These openings have a size of preferably 2 mm to 8 mm, particularly preferably of 2 mm to 4 mm.

An advantage of the invention is that a semiconductor material can be obtained which has an iron content and/or chromium content on the surface of less than $6.66 \times 10^{-11}$ g/cm$^2$, preferably an iron content and/or chromium content on the surface of less than $2 \times 10^{-11}$ g/cm$^2$, particularly preferably of $1 \times 10^{-11}$ g/cm$^2$. Furthermore, the semiconductor material cleaned in this way no longer exhibits any stains, such as those which otherwise occur with standard cleaning devices.

Comparison of Various Cleaning Methods According to the Prior Art

The iron values are specified in $10^{-11}$ g/cm$^2$.

TABLE 1

| Method | Literature reference | Mean iron value | Standard deviation | Number of values |
|---|---|---|---|---|
| Etch HF/HNO$_3$ 20 min 50 μm | 5/3 | 23.31 | 19.98 | 15 |
| HCl/H$_2$O$_2$ | 1,2 | 59.94 | 99.9 | 12 |
| HF 5% w/w HCl 8% w/w H$_2$O$_2$ 2% w/w | 1,2 | 13.32 | 13.32 | 1,000 |
| RCA cleaning | 1,2 | 9.96 | 39.96 | 14 |
| HF/H$_2$O$_2$ | 4 | 1.98 | 13.32 | 15 |
| HCl/HNO$_3$ 15 min HF 5% w/w 5 min twice | 3 | 73.32 | 53.32 | 10 |

Literature References:
1.) RCA cleaning, RCA Review, June 1970, W. Kern.
2.) Semiconductor International, April 1984, Cleaning Si and SiO$_2$ Surfaces with Hydrogen Peroxide.
3.) Offenlegungsschrift DE 195 29518 A1 Tokuyama Corp., Polykristallines Silicium und Verfahren zur Herstellung (Polycrystalline silicon and method of production).
4.) Czochralski method for cleaning polysilicon by using a mixture of hydrogen fluoride, hydrogen peroxide and water, JP 05004811 A, Shinetsu Handotai Co. Ltd.
5.) Hi-silicon Co. Ltd. Kojundo Silicon KK, JP 05154466 A, Cleaning polysilicon by washing with a mixture of nitric and HF acid.

Performance of the Metal Analyses on the Cleaned Polysilicon Fragments

Polysilicon weighing 100 g is sprayed with 40 ml of 1:4 HF/HNO$_3$ in a Teflon beaker. The etching acid is collected in a Teflon beaker. The acid is then evaporated off and the residue is taken up in 5 ml of water. The metal content of the aqueous solution is measured using the ICP-AES (inductively coupled ion plasma atomic emission spectroscope supplied by the Spectro Company. The metal content of the polysilicon surface is calculated from the measured values. The data are in g/cm$^2$.

Comparison of Various Cleaning Methods for Removing Stainless Steel Abrasion from the Silicon Surface The iron values are specified in $10^{-11}$ g/cm$^2$.

TABLE 2

| Method | Mean iron value | Standard deviation | Mean chromium value | Standard deviation | Number of values |
|---|---|---|---|---|---|
| Etch HF/HNO$_3$ 20 min 50 μm | 23.31 | 19.98 | 13.32 | 1.33 | 15 |
| HCl/H$_2$O$_2$ | 59.94 | 99.9 | 19.98 | 2.22 | 12 |
| Pickle HF 5% w/w HCl 8% w/w H$_2$O$_2$ 3% w/w | 39.96 | 26.64 | 19.98 | 1.66 | 12 |
| Pickle/etch 12 μm | <6.66 | | <6.66 | | 13 |
| Etch HF/HNO$_3$ 60 min 400 μm | 19.98 | 16.65 | 13.32 | 1.33 | 10 |

The conditions, according to the invention, of the combined method are explained in greater detail in the following examples:

DETAILED DESCRIPTION OF PREFERRED EMBODIMENTS

EXAMPLE 1

A polysilicon ingot is contaminated during contact with metal tools on average with $1,332 \times 10^{-11}$ g/cm$^2$ iron on the polysilicon surface. The subsequent cleaning is carried out as described in Table 3. The necessary acid concentrations, the material removed by etching and the cleaning times for the production of polysilicon fragments having an iron content on the polysilicon surface of $<6.66 \times 10^{-11}$ g/cm$^2$ can be found in Table 3.

Conditions During the Performance of the Pickling/Etching Process

TABLE 3

| Substep | Reaction time | Temperature degrees C. | Material removed by etching |
|---|---|---|---|
| Rinsing with water | 5 minutes | 25 ± 5 degrees | — |
| Preliminary cleaning: Pickle HF 5% w/w HCl 8% w/w H$_2$O$_2$ 3% w/w | 20 minutes | 22 degrees | 0.02 μm |
| Rinsing | 5 minutes | 22 degrees | — |
| Main cleaning: Etching HF/HNO$_3$ HF 3% w/w HNO$_3$ 65% w/w | 5 minutes | 8 degrees | 12 μm |
| Rinsing | 5 minutes | 22 degrees | — |
| Hydrophilization | 5 minutes | 22 degrees | — |

TABLE 3-continued

| Substep | Reaction time | Temperature degrees C. | Material removed by etching |
|---|---|---|---|
| HCl 8% w/w | | | |
| H$_2$O$_2$ 2% w/w | | | |
| Rinsing | 5 minutes | 22 degrees | — |
| Drying with high-purity class 100 air | 20 minutes | 80 degrees | — |

EXAMPLE 2

100 g of polysilicon is abraded for 10 seconds with a V4A stainless steel screw. The uncleaned polysilicon contains on average $666,000 \times 10^{-11}$ g/cm$^2$ iron and $133,200 \times 10^{-11}$ g/cm$^2$ chromium on the surface. The subsequent cleaning is carried out as described in Table 3.

EXAMPLE 3

A polysilicon ingot is comminuted in a crusher having metal jaws. The uncleaned material contains on average $5,328 \times 10^{-11}$ g/cm$^2$ iron on the polysilicon surface. The subsequent cleaning is carried out as described in Table 4. The required acid concentrations, the material removed by etching and the cleaning times for the production of polysilicon fragments having an iron content on the surface of $<6.66 \times 10^{-11}$ g/cm$^2$ can be found in the table.

Conditions During the Performance of the Pickling/Etching Process for Material from Example 3

TABLE 4

| Substep | Reaction time | Temperature degrees C. | Material removed by etching |
|---|---|---|---|
| Rinsing with water | 6 minutes | 25 ± 5 degrees | — |
| Preliminary cleaning: Pickle | 48 minutes | 22 degrees | 0.05 μm |
| HF 5% w/w | | | |
| HCl 8% w/w | | | |
| H$_2$O$_2$ 3% w/w | | | |
| Rinsing | 6 minutes | 22 degrees | — |
| Main cleaning: | 12 minutes | 8 degrees | 40 μm |
| Etching HF/HNO$_3$ | | | |
| HF 3% w/w | | | |
| HNO$_3$ 65% w/w | | | |
| Rinsing | 6 minutes | 22 degrees | — |
| Hydrophilization | 12 minutes | 22 degrees | — |
| HCl 8% w/w | | | |
| H$_2$O$_2$ 2% w/w | | | |
| Rinsing | 5 minutes | 22 degrees | — |
| Drying with high-purity class 100 air | 20 minutes | 80 degrees | — |

Polysilicon heavily contaminated with iron and chromium having a particle diameter of 0.1 to 350 mm can be cleaned to an iron content and chromium content of $<6.66 \times 10^{-11}$ g/cm$^2$ on the surface by a combined method involving a main cleaning step comprising two stages (main cleaning with a cleaning solution containing hydrofluoric acid and nitric acid, the content of nitric acid being less than 70% w/w and a further step with a cleaning solution containing hydrofluoric acid and nitric acid, the content of nitric acid being less than 70% w/w). Compared with the three-stage combined 12 μm method, less than 5 μm of the silicon surface is removed in this four-stage process.

Comparison of the Two Combined Cleaning Methods

The iron values are specified in $10^{-11}$ g/cm$^2$.

TABLE 5

| Method | Mean iron values | Standard deviation | Number of values |
|---|---|---|---|
| Three-stage method with material removal by etching of 12 μm | 3.33 | 3.33 | 300 |
| Four-stage method with a material removal by etching of <5 μm | 3.33 | 3.33 | 20 |

In contrast to the three-stage method, stained grey fragments are obtained in the first etching step (material removed approximately 2 μm) in the HF/HNO$_3$ containing 0.5% w/w HF and less than 70% w/w HNO$_3$. Even after the first etch, the iron content of $3.33 \times 10^{-11}$ g/cm$^2$ is reached on the polysilicon surface. The second etching step (approximately 2 μm) takes place with 0.5% w/w HF and more than 70% w/w HNO$_3$. This acid treatment removes the grey stains.

The reduction of the material removed by etching from 12 to less than 5 μm compared with the three-stage method reduces the acid consumption and the NO$_x$ gas evolution (see Table 6) by more than 50%.

Comparison of the NO$_x$ gas evolution and the acid consumption between the three-stage and four-stage combined cleaning methods.

Concentration of the Acids Used

HNO$_3$: 70% w/w
HF: 50% w/w

TABLE 6

| Method | HF/HNO$_3$ consumption for 480 kg of polysilicon fragments | NO$_x$ content for 3000 m$^3$ of waste air |
|---|---|---|
| Three-stage method, 12 μm | 220 liters HNO$_3$ 27 liters HF | 1000 mg/m$^3$ |
| Four-stage method, <5 μm | 100 liters HNO$_3$ 10 liters HF | 350 mg/m$^3$ |

When the polysilicon is dissolved, HF is consumed and water is simultaneously produced (see Reaction Equation 1). To maintain the bath concentration in relation to the HNO$_3$ content and HF content, hydrofluoric acid and nitric acid must therefore continuously be made up. Advantages in the acid consumption arise as a result of the use of 100% w/w HNO$_3$ and 70% w/w HF or HF gas (see Table 7).

$$3Si + 4HNO_3 + 18HF \Longleftrightarrow 3H_2SiF_6 + 4NO + 8H_2O \quad \text{Reaction Equation No. 1}$$

Comparison of the Acid Consumptions in the Various Metering Methods

TABLE 7

| Method | $HF/HNO_3$ consumption using 70% w/w $HNO_3$ and 50% w/w HF for 480 kg of polysilicon fragments | $HF/HNO_3$ consumption using 100% w/w $HNO_3$ and 70% w/w HF for 480 kg of polysilicon fragments |
|---|---|---|
| Three-stage method, 12 μm removal | 220 liters $HNO_3$ 27 liters HF | 50 liters $HNO_3$ 15 liters HF |
| Four-stage method, <5 μm removal | 100 liters $HNO_3$ 10 liters HF | 20 liters $HNO_3$ 6 liters HF |

Performance of the Metal Analyses on Cleaned Polysilicon Fragments

Polysilicon weighing 100 g is sprayed with 40 ml of 1:4 $HF/HNO_3$ in a Teflon beaker. The etching acid is collected in a Teflon beaker. The acid is then evaporated off and the residue is taken up in 5 ml of water. The metal content of the aqueous solution is measured using the ICP-AES (inductively coupled ion plasma atomic emission spectroscope supplied by the Spectro Company). The metal content of the polysilicon surface is calculated from the measured values. The data are in $g/cm^2$.

In the following examples, the experimental conditions of the four-stage combined method are explained in greater detail:

EXAMPLE 4

A polysilicon ingot is contaminated during contact with metal tools on average with $1,332 \times 10^{-11}$ $g/cm^2$ iron on the polysilicon surface. The subsequent cleaning is carried out as described in Table 8. The necessary acid concentrations, the material removed by etching and the cleaning times for the production of polysilicon fragments having an iron content on the polysilicon surface of $<6.66 \times 10^{-11}$ $g/cm^2$ can be found in the table.

Conditions During the Performance of the Pickling/Etching Process

TABLE 8

| Substep | Reaction time | Temperature degrees C. | Material removed by etching |
|---|---|---|---|
| Rinsing with water | 5 minutes | 25 ± 5 degrees | — |
| Preliminary cleaning: Pickle HF 5% w/w HCl 8% w/w $H_2O_2$ 3% w/w | 20 minutes | 22 degrees | 0.02 μm |
| Rinsing | 5 minutes | 22 degrees | — |
| Main cleaning: Etch No. 1 $HF/HNO_3$ 0.6% w/w HF 63% w/w $HNO_3$ | 2.5 minutes | 8 degrees | 2 μm |
| Main cleaning: Etch No. 2 $HF/HNO_3$ 0.6% w/w HF >70% w/w $HNO_3$ | 2.5 minutes | 8 degrees | 2 μm |
| Rinsing | 5 minutes | 22 degrees | — |
| Hydrophilization HCl 8% w/w $H_2O_2$ 3% w/w | 5 minutes | 22 degrees | — |
| Rinsing | 5 minutes | 22 degrees | — |
| Drying with high/purity class 100 air | 20 minutes | 80 degrees | — |

EXAMPLE 5

100 g of polysilicon is abraded for 10 seconds with a V4A stainless steel screw. The uncleaned polysilicon contains on average $666,000 \times 10^{-11}$ $g/cm^2$ iron and $133,200 \times 10^{-11}$ $g/cm^2$ chromium on the surface. The subsequent cleaning is carried out as described in Table 8.

EXAMPLE 6

A polysilicon ingot is comminuted in a crusher having metal jaws. The uncleaned material contains on average $5,328 \times 10^{-11}$ $g/cm^2$ iron on the polysilicon surface. The subsequent cleaning is carried out as described in Table 9. The required acid concentrations, the material removed by etching and the cleaning times for the production of polysilicon fragments having an iron content on the polysilicon surface of $<6.66 \times 10^{-11}$ $g/cm^2$ can be found in the table.

Conditions During the Performance of the Pickling/Etching Process for Material from Example 6

TABLE 9

| Substep | Reaction time | Temperature degrees C. | Material removed by etching |
|---|---|---|---|
| Rinsing with water | 5 minutes | 25 ± 5 degrees | — |
| Preliminary cleaning: Pickle HF 5% w/w HCl 8% w/w $H_2O_2$ 3% w/w | 48 minutes | 22 degrees | 0.02 μm |
| Rinsing | 6 minutes | 22 degrees | — |
| Main cleaning: Etch No. 1 $HF/HNO_3$ HF 0.6% w/w $HNO_3$ 63% w/w | 6 minutes | 8 degrees | 5 μm |
| Main cleaning: Etch No. 2 $HF/HNO_3$ HF 0.6% w/w $HNO_3$ >70% w/w | 6 minutes | 8 degrees | 5 μm |
| Rinsing | 6 minutes | 22 degrees | — |

TABLE 9-continued

| Substep | Reaction time | Temperature degrees C. | Material removed by etching |
|---|---|---|---|
| Hydrophilization HCl 8% w/w H$_2$O$_2$ 3% w/w | 12 minutes | 22 degrees | — |
| Rinsing | 6 minutes | 22 degrees | — |
| Drying with high-purity class 100 air | 20 minutes | 80 degrees | — |

Influence of the Type of Lifting/Lowering Movement on the Pickling/Etching Process
The iron values are specified in $10^{-11}$ g/cm$^2$

TABLE 10

| Type of lifting/lowering movement | Mean iron values | Standard deviation | Number of values |
|---|---|---|---|
| Lifting and lowering in the acid only | 13.32 | 13.32 | 25 |
| Movement in which the process dish is continuously filled and drained | 3.33 | 3.33 | 200 |

While a few embodiments of the present invention have been shown and described, it is to be understood that many changes and modifications may be made thereunto without departing from the spirit and scope of the invention as defined in the appended claims.

What is claimed is:

1. A method for producing semiconductor material which has a low metal concentration comprising
    washing semiconductor material in a preliminary cleaning in at least one first stage with an oxidizing cleaning solution which contains a mixture of hydrofluoric acid, hydrochloric acid and hydrogen peroxide;
    washing the semiconductor material in a main cleaning in a further stage with an aqueous cleaning solution which contains nitric acid and hydrofluoric acid; and,
    during hydrophilization, washing the semiconductor material in a still further stage with an oxidizing cleaning liquid.

2. The method for producing semiconductor material which has a low metal concentration as claimed in claim 1 further comprising
    washing the semiconductor material during the main cleaning with an additional liquid cleaning agent selected from the group consisting of a liquid organic acid, a mineral acid, hydrogen peroxide and the mixtures thereof.

3. The method for producing semiconductor material which has a low metal concentration, as claimed in claim 1, comprising
    washing the semiconductor material during the hydrophilization with a liquid cleaning agent selected from the group consisting of a liquid organic acid, a mineral acid, hydrogen peroxide, and the mixtures thereof.

4. The method for producing semiconductor material which has a low metal concentration, as claimed in claim 1 comprising
    placing the semiconductor material in a container having openings;
    immersing the container having openings in a cleaning liquid and said cleaning liquid flowing in through the openings and wetting the semiconductor material; and
    raising the container far enough out of the cleaning liquid for the cleaning liquid to flow completely out through the openings in the container.

5. The method for producing semiconductor material which has a low metal concentration, as claimed in claim 4 comprising
    immersing said container containing the semiconductor material at least twice in the cleaning liquid by means of a lifting movement and a lowering movement.

6. The method for producing semiconductor material which has a low metal concentration, as claimed in claimed 1,
    wherein the semiconductor material is silicon.

7. A method for producing semiconductor material which has a low metal concentration comprising
    washing semiconductor material in a preliminary cleaning in at least one first stage with an oxidizing cleaning solution;
    washing the semiconductor material during a main cleaning with a cleaning solution containing hydrofluoric acid and nitric acid, the content of nitric acid being less than 70% w/w; and
    washing the semiconductor material in a further stage with a cleaning solution which contains hydrofluoric acid and nitric acid, the content of nitric acid being greater than 70% w/w; and
    during hydrophilization, washing the semiconductor material in a still further stage with an oxidizing cleaning liquid.

* * * * *